(12) United States Patent
Shibata et al.

(10) Patent No.: US 9,395,505 B2
(45) Date of Patent: Jul. 19, 2016

(54) OPTO-ELECTRIC HYBRID MODULE

(71) Applicant: NITTO DENKO CORPORATION, Ibaraki-shi, Osaka (JP)

(72) Inventors: Naoki Shibata, Ibaraki (JP); Yuichi Tsujita, Ibaraki (JP); Naoyuki Tanaka, Ibaraki (JP); Shotaro Masuda, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/761,398

(22) PCT Filed: Dec. 11, 2013

(86) PCT No.: PCT/JP2013/083148
§ 371 (c)(1),
(2) Date: Jul. 16, 2015

(87) PCT Pub. No.: WO2014/125713
PCT Pub. Date: Aug. 21, 2014

(65) Prior Publication Data
US 2015/0355422 A1    Dec. 10, 2015

(30) Foreign Application Priority Data

Feb. 15, 2013   (JP) ................. 2013-028102

(51) Int. Cl.
*G02B 6/42* (2006.01)
*H05K 1/02* (2006.01)

(52) U.S. Cl.
CPC .............. *G02B 6/4231* (2013.01); *G02B 6/428* (2013.01); *G02B 6/4293* (2013.01);
(Continued)

(58) Field of Classification Search
USPC ........................................... 385/88
See application file for complete search history.

(56) References Cited

U.S. PATENT DOCUMENTS

| 7,333,682 B2 | 2/2008 | Kobayashi et al. |
| 2002/0131727 A1* | 9/2002 | Reedy ............... G02B 6/4214 385/88 |

(Continued)

FOREIGN PATENT DOCUMENTS

| CN | 1761107 A | 4/2006 |
| JP | 2005-115190 A | 4/2005 |

(Continued)

OTHER PUBLICATIONS

International Search Report dated Jan. 14, 2014, issued in corresponding application No. PCT/JP2013/083148 (2 pages).
(Continued)

*Primary Examiner* — Eric Wong
(74) *Attorney, Agent, or Firm* — Westerman, Hattori, Daniels & Adrian, LLP

(57) ABSTRACT

There is provided an opto-electric hybrid module in which an optical element of an optical element unit and a core of an optical waveguide of an opto-electric hybrid unit are aligned with each other simply and precisely. The opto-electric hybrid module includes: a connector including an optical element; and an opto-electric hybrid unit including an electric circuit board and an optical waveguide which are stacked together. The connector includes aligning protrusions positioned and formed in a predetermined position with respect to the optical element. The opto-electric hybrid unit includes fitting holes for fitting engagement with the aligning protrusion, the fitting holes being positioned and formed in a predetermined position with respect to an end surface of a core of the optical waveguide. The connector and the opto-electric hybrid unit are coupled together.

1 Claim, 9 Drawing Sheets

(52) U.S. Cl.
CPC .......... *H05K 1/0274* (2013.01); *G02B 6/4214* (2013.01); *H05K 2201/10121* (2013.01); *H05K 2201/10189* (2013.01)

(56) References Cited

U.S. PATENT DOCUMENTS

| | | | |
|---|---|---|---|
| 2006/0067608 A1 | 3/2006 | Kobayashi et al. | |
| 2006/0067630 A1* | 3/2006 | Kim | G06F 1/1683 385/88 |
| 2006/0078248 A1* | 4/2006 | Sasaki | G02B 6/4214 385/14 |
| 2010/0129035 A1* | 5/2010 | Teo | G02B 6/4201 385/88 |
| 2011/0235964 A1 | 9/2011 | Masuda et al. | |
| 2012/0251036 A1 | 10/2012 | Inoue et al. | |

FOREIGN PATENT DOCUMENTS

| | | |
|---|---|---|
| JP | 2006-30224 A | 2/2006 |
| JP | 2009-223063 A | 10/2009 |
| JP | 2010-54916 A | 3/2010 |
| JP | 2011-59353 A | 3/2011 |

OTHER PUBLICATIONS

Translation of International Preliminary Report on Patentability (Form PCT/IB/373) issued in counterpart International Application No. PCT/JP2013/083148 dated Aug. 27, 2015, with Form PCT/ISA/237 (6 pages).

Office Action dated Jan. 25, 2016, issued in counterpart Chinese Application No. 2013800705400, with English translation (14 pages).

* cited by examiner

OPTO-ELECTRIC HYBRID MODULE

TECHNICAL FIELD

The present invention relates to an opto-electric hybrid module in which an opto-electric hybrid unit including an electric circuit board and an optical waveguide which are stacked together and an optical element unit including an optical element mounted therein are coupled together so as to be capable of light propagation.

BACKGROUND ART

With the increase in the amount of transmission information, optical interconnect lines for transmitting optical signals in addition to electrical interconnect lines have been used in recent electronic devices and the like. Specifically, an opto-electric hybrid module including an opto-electric hybrid unit in which an optical waveguide serving as optical interconnect lines is stacked on an electric circuit board having electrical interconnect lines formed thereon, and an optical element unit in which an optical element such as a light-emitting element for converting an electric signal into an optical signal and a light-receiving element for converting an optical signal into an electric signal are mounted is incorporated in such an electronic device as described above.

In the opto-electric hybrid module, it is necessary that light emitted from the light-emitting element enters one end surface (light entrance) of each core (optical interconnect line) of the optical waveguide and that the light-receiving element receives light exiting from the other end surface (light exit) of each core. It is hence necessary that the optical elements (light-emitting element and light-receiving element) and the cores are aligned with each other so as to be capable of light propagation.

A method capable of simply aligning the optical element and the core with each other has been hitherto proposed (see Patent Literature 1, for example). In this method, an alignment member having an aligning hole is attached to an end portion of an optical waveguide, and an aligning pin for fitting engagement with the hole is formed in an optical element unit. By bringing the hole of the alignment member and the pin of the optical element unit into fitting engagement with each other, this method automatically aligns the core of the optical waveguide and the optical element with each other so as to be capable of light propagation.

RELATED ART DOCUMENT

Patent Document

PTL 1: JP-A-2009-223063

SUMMARY

Unfortunately, the aforementioned method performs the alignment simply but cannot properly achieve the light propagation in some cases. Specifically, the aforementioned method requires the alignment member to be attached to the optical waveguide. At this time, there are cases where misalignment between the alignment member and the optical waveguide occurs. Even when the hole of the alignment member and the pin of the optical element unit are brought into fitting engagement with each other, the occurrence of this misalignment results in a failure of alignment between the core of the optical waveguide and the optical element of the optical element unit. As a result, proper light propagation cannot be achieved.

In view of the foregoing, it is therefore an object of the present invention to provide an opto-electric hybrid module in which a core of an optical waveguide of an opto-electric hybrid unit and an optical element of an optical element unit are aligned with each other simply and precisely.

To accomplish the aforementioned object, an opto-electric hybrid module according to the present invention comprises: an optical element unit including an optical element; and an opto-electric hybrid unit including an electric circuit board and an optical waveguide which are stacked together, wherein the optical element unit includes an aligning protrusion positioned and formed in a predetermined position with respect to the optical element, wherein the opto-electric hybrid unit includes a fitting hole for fitting engagement with the aligning protrusion, the fitting hole being positioned and formed in a predetermined position with respect to an end surface of a core for an optical path of the optical waveguide, wherein the optical element unit and the opto-electric hybrid unit are coupled together, with the aligning protrusion of the optical element unit fitted in the fitting hole of the opto-electric hybrid unit, whereby the optical element and the core for an optical path are aligned with each other so as to be capable of light propagation.

The opto-electric hybrid module according to the present invention is configured such that the optical element unit and the opto-electric hybrid unit are coupled together, with the aligning protrusion of the optical element unit fitted in the fitting hole of the opto-electric hybrid unit. In the optical element unit, the optical element and the aligning protrusion are in determined positional relationship with each other. In the opto-electric hybrid unit, the end surface of the core and the fitting hole for fitting engagement with the aligning protrusion are in determined positional relationship with each other. Thus, with the optical element unit and the opto-electric hybrid unit coupled together, the aligning protrusion is fitted in the fitting hole. Therefore, the optical element of the optical element unit and the core of the opto-electric hybrid unit are automatically aligned with each other so as to be capable of light propagation. That is, the opto-electric hybrid module according to the present invention is configured such that the simple operation of fitting the aligning protrusion of the optical element unit into the fitting hole of the opto-electric hybrid unit allows the precise alignment between the core and the optical element, thereby achieving proper light propagation.

BRIEF DESCRIPTION OF DRAWINGS

FIGS. 1A and 1B schematically show a first embodiment of an opto-electric hybrid module according to the present invention, in which FIG. 1A is a plan view thereof, and FIG. 1B is a vertical sectional view thereof.

FIGS. 2A and 2B schematically show a connector for the opto-electric hybrid module, in which FIG. 2A is a plan view thereof, and FIG. 2B is a vertical sectional view thereof.

FIGS. 3A and 3B schematically show an opto-electric hybrid unit for the opto-electric hybrid module, in which FIG. 3A is a vertical sectional view thereof, and FIG. 3B is a bottom view thereof.

DESCRIPTION OF EMBODIMENTS

Next, embodiments according to the present invention will now be described in detail with reference to the drawings.

Figure 1A:
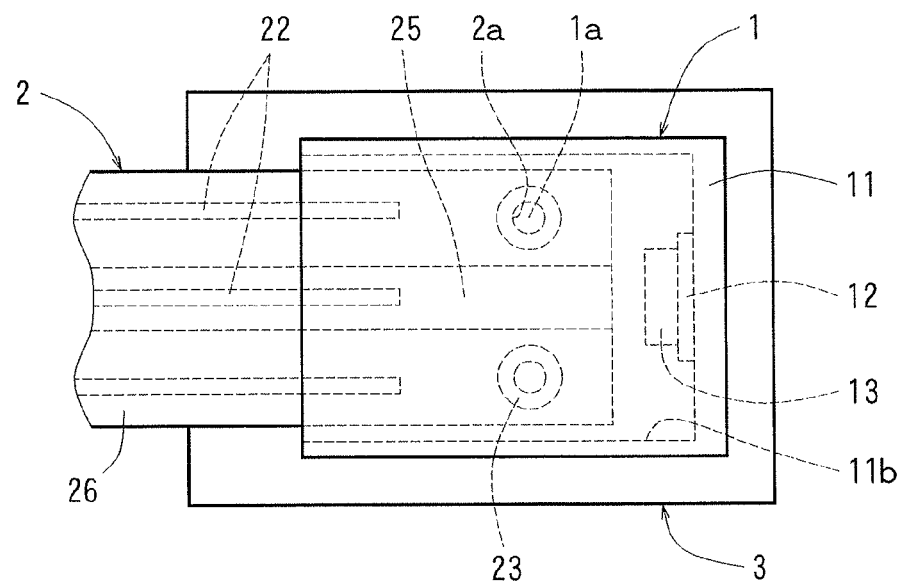
Figure 1B:
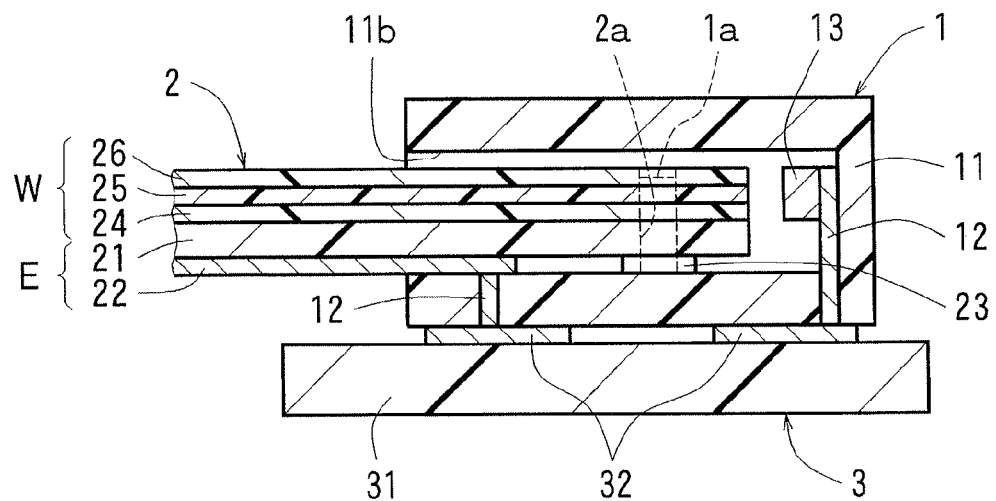

FIG. 1A is a plan view schematically showing a first embodiment of an opto-electric hybrid module according to the present invention, and FIG. 1B is a vertical sectional view thereof. For the purpose of clarifying the arrangement of components, only some of the components are shown in FIG. 1A. The opto-electric hybrid module of this embodiment is formed by: individually producing a connector (optical element unit) 1 having aligning protrusions 1a, an opto-electric hybrid unit 2 having fitting holes 2a for fitting engagement with the aligning protrusions 1a, and a board 3 for attaching the connector 1 thereto; fitting the aligning protrusions 1a of the connector 1 into the fitting holes 2a of the opto-electric hybrid unit 2; and attaching the connector 1 to the board 3 in that state. Thus, the connector 1, the opto-electric hybrid unit 2 and the board 3 are integrally coupled together to form the opto-electric hybrid module.

In the connector 1, an optical element 13 is positioned and mounted in a predetermined position with respect to the aligning protrusions 1a. In the opto-electric hybrid unit 2, one end surface (light-transmissive surface) of a core 25 of an optical waveguide W is positioned and formed in a predetermined position with respect to the fitting holes 2a. In the opto-electric hybrid module, the fitting engagement between the aligning protrusions 1a and the fitting holes 2a (the coupling of the connector 1 and the opto-electric hybrid unit 2) thus automatically brings the optical element 13 and the one end surface of the core 25 into precise alignment and into face-to-face relationship with each other so that light propagation therebetween is achieved. The alignment between the board 3 and the connector 1 does not require high precision.

Figure 2A:
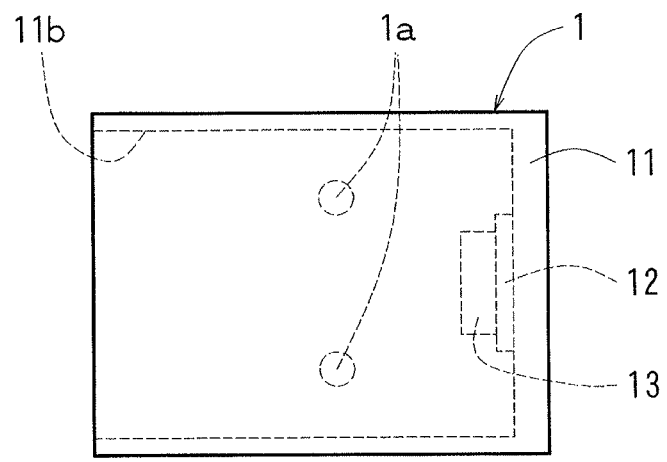
Figure 2B:
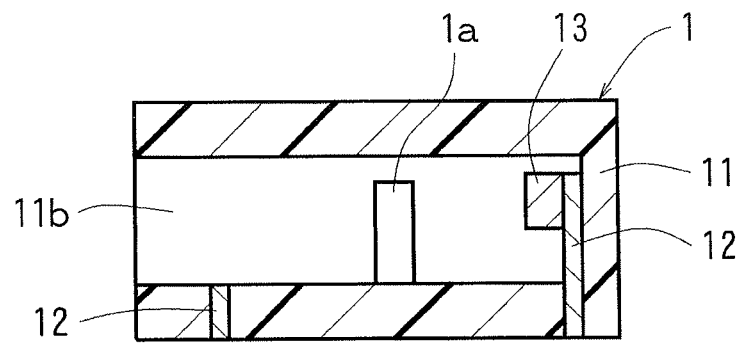

More specifically, the connector 1 includes a connector body 11, electrical interconnect lines 12 formed in the connector body 11, and the optical element 13 electrically connected to the electrical interconnect lines 12, as shown in plan view in FIG. 2A and in vertical sectional view in FIG. 2B. The connector body 11 includes a recessed portion 11b for receiving one end portion of the opto-electric hybrid unit 2. The optical element 13 is mounted on an inner wall surface of the recessed portion 11b, and the two aligning protrusions 1a each having a cylindrical shape are formed on one side wall surface [a lower surface in FIG. 2B] of the recessed portion 11b.

Figure 3A:
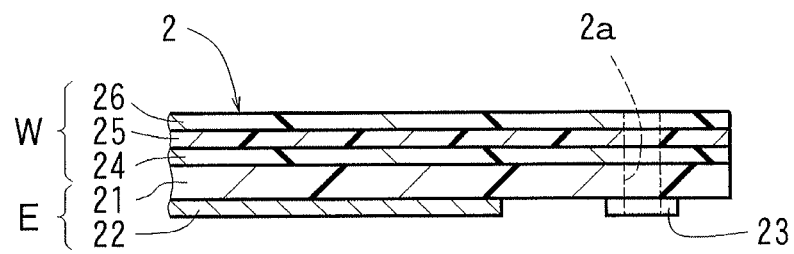
Figure 3B:
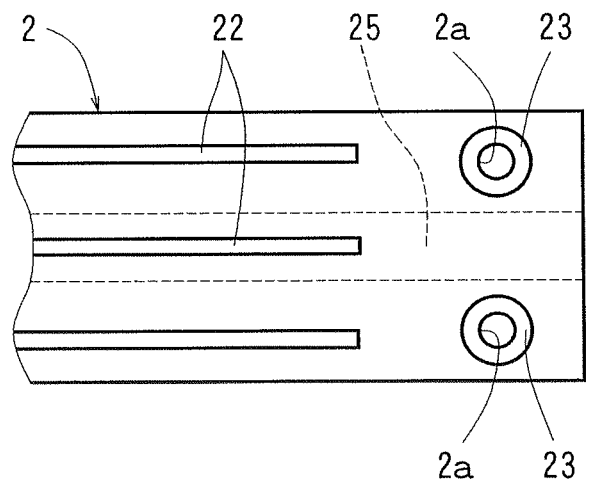

The opto-electric hybrid unit 2 includes an electric circuit board E [a lower portion in FIG. 3B] and the optical waveguide W [an upper portion in FIG. 3B] which are stacked together, as shown in vertical sectional view in FIG. 3A and in bottom view in FIG. 3B. The electric circuit board E includes an insulative sheet (insulating layer) 21, and electrical interconnect lines 22 and annular fitting hole positioning interconnect lines 23 which are formed on the lower surface of the insulative sheet 21. The optical waveguide W includes an under cladding layer 24 formed on the upper surface of the insulative sheet 21 of the electric circuit board E, the core 25 for an optical path which is formed in a linear predetermined pattern on the upper surface of the under cladding layer 24, and an over cladding layer 26 formed on the upper surface of the under cladding layer 24 so as to cover the core 25. The two fitting holes 2a of a circular cross-sectional configuration extend across the thickness of the opto-electric hybrid unit 2. The fitting holes 2a are formed in positions corresponding to the aligning protrusions 1a, and have an inside diameter slightly greater than the outside diameter of the aligning protrusions 1a. With the electric circuit board E and the connector 1 coupled to each other, the electrical interconnect lines 22 of the electric circuit board E are electrically connected to the electrical interconnect lines 12 of the connector 1.

Figure 4:
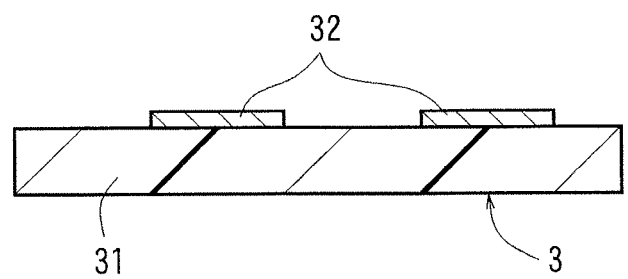
FIG. 4 is a vertical sectional view schematically showing a board for the opto-electric hybrid module.

The board 3 includes an insulative substrate 31, and electrical interconnect lines 32 formed on a surface of the insulative substrate 31, as shown in vertical sectional view in FIG. 4. With the connector 1 coupled to the opto-electric hybrid unit 2 and attached to the board 3, the electrical interconnect lines 32 of the board 3 are electrically connected to the electrical interconnect lines 12 of the connector 1 and to the electrical interconnect lines 22 of the opto-electric hybrid unit 2.

Figure 5A:
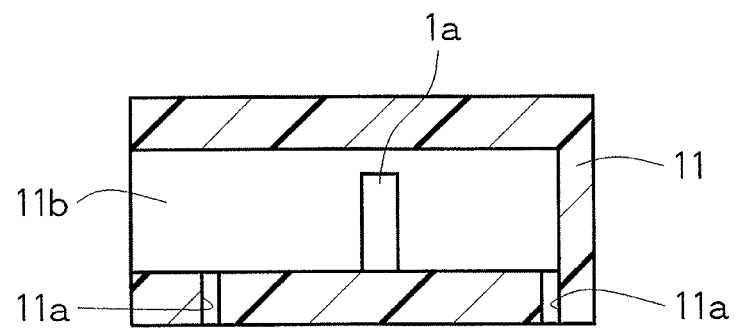
FIGS. 5A to 5C are views schematically illustrating the steps of producing the connector.
Figure 5B:
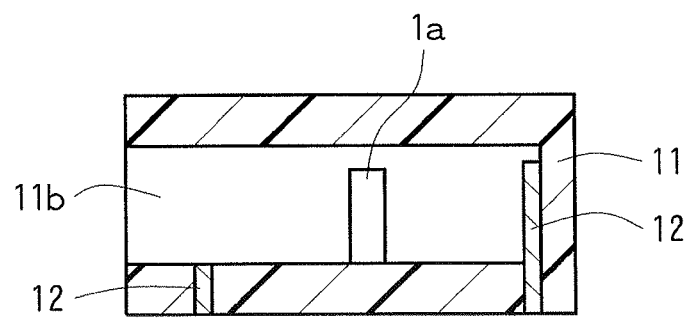
Figure 5C:
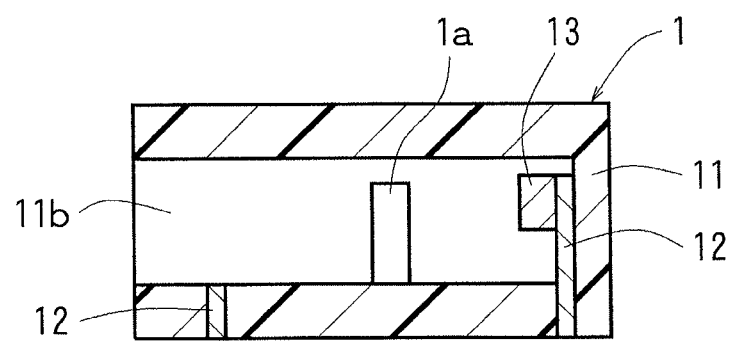
Figure 7A:
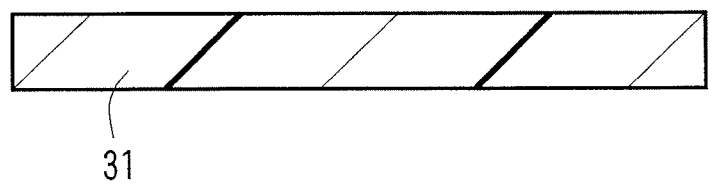
FIGS. 7A and 7B are views schematically illustrating the steps of producing the board.
Figure 7B:
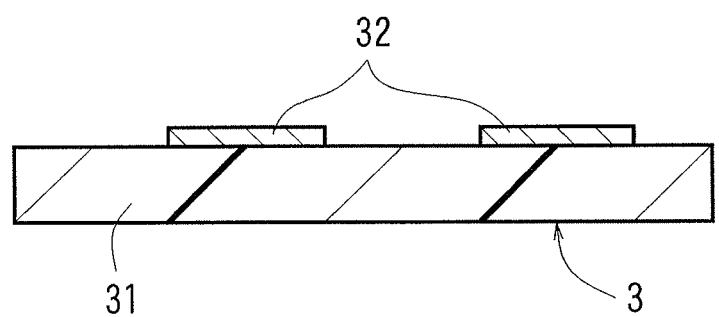

The opto-electric hybrid module is manufactured by the following process steps (1) to (4):

(1) the step of producing the connector 1 [with reference to FIGS. 5A to 5C];

(2) the step of producing the opto-electric hybrid unit 2 [with reference to FIGS. 6A to 6E];

(3) the step of producing the board 3 [with reference to FIGS. 7A and 7B]; and (4) the step of coupling one end portion of the opto-electric hybrid unit 2 to the connector 1 and thereafter attaching the connector 1 in that state to the board 3 (with reference to FIG. 1).

[(1) Step of Producing Connector 1]

The step of producing the connector 1 in (1) will be described. First, as shown in FIG. 5A, the connector body 11 made of resin is formed by molding. The aligning protrusions 1a are formed integrally with the connector body 11. Also, through holes 11a for the electrical interconnect lines are formed in regions where the electrical interconnect lines 12 are to be formed in the next step [with reference to FIG. 5B]. Next, as shown in FIG. 5B, the electrical interconnect lines 12 are formed in the connector body 11. Then, as shown in FIG. 5C, the optical element 13 is mounted in a proper position with reference to the aligning protrusions 1a. The connector 1 is produced in this manner.

[(2) Step of Producing Opto-Electric Hybrid Unit 2]

The step of producing the opto-electric hybrid unit 2 in (2) will be described. First, the insulative sheet 21 [with reference to FIG. 6A] made of an insulative material such as polyimide resin is prepared. This insulative sheet 21 has a thickness in the range of 5 to 15 µm, for example.

Figure 6A:
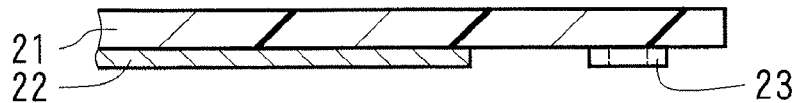
FIGS. 6A to 6E are views schematically illustrating the steps of producing the opto-electric hybrid unit.

Next, as shown in FIG. 6A, the electrical interconnect lines 22 and the annular fitting hole positioning interconnect lines 23 are simultaneously formed on one surface [a lower surface in FIG. 6A] of the insulative sheet 21. For example, a semi-additive method is used for the formation of the electrical interconnect lines 22 and the fitting hole positioning interconnect lines 23.

In the semi-additive method, a metal layer (having a thickness on the order of 60 to 260 nm) is initially formed on one surface of the insulative sheet 21 by sputtering, electroless plating and the like. This metal layer becomes a seed layer (a layer serving as a basis material for the formation of an electroplated layer) for a subsequent electroplating process. Then, a photosensitive resist is laminated onto the opposite surfaces of a laminate comprised of the insulative sheet 21 and the seed layer. Thereafter, a photolithographic process is performed to form holes having the pattern of the electrical interconnect lines 22 and the fitting hole positioning interconnect lines 23 at the same time in the photosensitive resist on the side where the seed layer is formed, so that surface portions of the seed layer are uncovered at the bottoms of the holes. Next, electroplating is performed to form electroplated layers (having a thickness on the order of 5 to 20 μm) in a stacked manner on the surface portions of the seed layer uncovered at the bottoms of the holes. Then, the photosensitive resist is stripped away using a sodium hydroxide aqueous solution and the like. Thereafter, part of the seed layer on which the electroplated layers are not formed is removed by soft etching, so that laminate portions comprised of the remaining seed layers and the electroplated layers are formed into the electrical interconnect lines 22 and the annular fitting hole positioning interconnect lines 23.

Figure 6B:
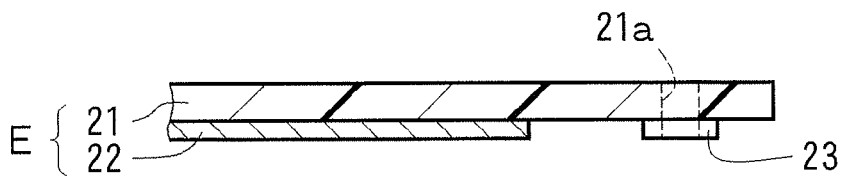

Then, as shown in FIG. 6B, parts of the insulative sheet 21 corresponding to the central circular portions (future fitting hole regions) of the annular fitting hole positioning interconnect lines 23 are etched away by using a chemical etchant, so that first through holes 21a serving as part of the fitting holes 2a are formed. An exemplary method of forming the first through holes 21a is as follows. A surface on the electrical interconnect lines 22 side and a surface on the insulative sheet 21 side are photographed by means of a camera of an exposure machine. Based on the taken images, the positions on the back surface side of the future fitting hole regions are properly determined by using the annular fitting hole positioning interconnect lines 23 on the electrical interconnect lines 22 side as a guide. Next, the insulative sheet 21 side except the circular future fitting hole regions is covered with a dry film resist (not shown). Next, exposed parts of the insulative sheet 21 corresponding to the circular future fitting hole regions are etched away by using a chemical etchant. The etched-away parts are formed into the first through holes 21a. Thereafter, the dry film resist is stripped away using a sodium hydroxide aqueous solution and the like. The electric circuit board E is provided in this manner.

Figure 6C:
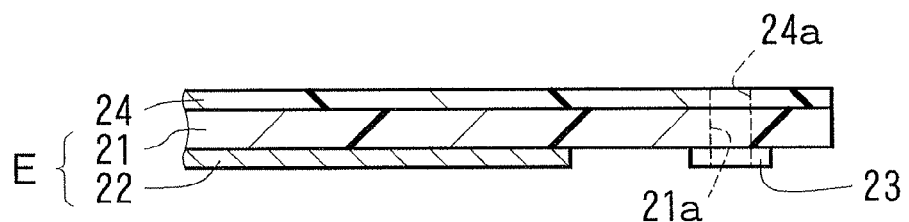

Next, as shown in FIG. 6C, the under cladding layer 24 is formed by a photolithographic process on a surface [an upper surface in FIG. 6C] lying on the opposite side of the insulative sheet 21 from the surface on which the electrical interconnect lines are formed. At this time, second through holes 24a coaxial with the first through holes 21a are formed in the under cladding layer 24. An example of the material for the formation of the under cladding layer 24 includes a photosensitive resin such as a photosensitive epoxy resin. The under cladding layer 24 has a thickness in the range of 5 to 50 μm, for example.

Figure 6D:
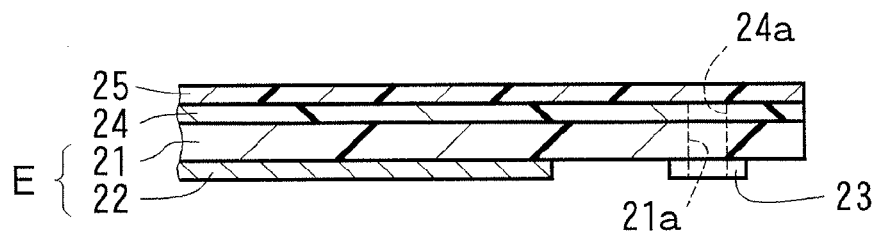

Next, as shown in FIG. 6D, the core 25 having a predetermined pattern is formed by a photolithographic process on the surface of the under cladding layer 24. At this time, a photomask for use in the formation of the core 25 is formed so as to be positioned with reference to alignment marks formed at the same time as the fitting hole positioning interconnect lines 23. That is, one end surface of the core 25 formed using the photomask is formed in a proper position with respect to the first through holes 21a. The core 25 is clear of the second through holes 24a of the under cladding layer 24. The core 25 has, for example, the following dimensions: a height in the range of 20 to 100 μm, and a width in the range of 20 to 100 μm.

Figure 6E:
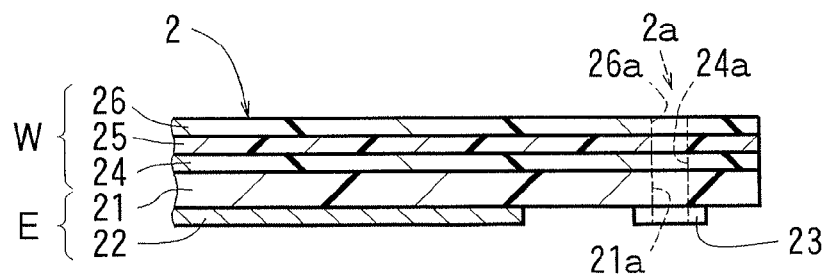

Then, as shown in horizontal sectional view in FIG. 6E, the over cladding layer 26 is formed by a photolithographic process on the surface of the under cladding layer 24 so as to cover the core 25. At this time, third through holes 26a coaxial with the first and second through holes 21a and 24a are formed in the over cladding layer 26. Continuous holes comprised of the first to third through holes 21a, 24a and 26a are formed into the fitting holes 2a. The over cladding layer 26 has a thickness (a thickness as measured from the surface of the under cladding layer 24) in a range greater than the thickness of the core 25 and not greater than 1000 μm. The optical waveguide W is formed in this manner. At the same time, the opto-electric hybrid unit 2 in which one end surface of the core 25 is formed in a predetermined position with respect to the fitting holes 2a is produced.

[(3) Step of Producing Board 3]

The step of producing the board 3 in (3) will be described. First, as shown in FIG. 7A, the insulative substrate 31 is prepared. Next, as shown in FIG. 7B, the electrical interconnect lines 32 are formed on a surface of the insulative substrate 31. In this manner, the board 3 including the insulative substrate 31 and the electrical interconnect lines 32 is produced.

[(4) Step of Coupling Connector 1 and Opto-Electric Hybrid Unit 2 and Thereafter Attaching Connector 1 to Board 3]

Next, the connector 1 and the opto-electric hybrid unit 2 are coupled to each other. This coupling is performed by inserting one end portion of the opto-electric hybrid unit 2 into the recessed portion 11b of the connector 1 and fitting the aligning protrusions 1a formed in the recessed portion 11b into the fitting holes 2a of the opto-electric hybrid unit 2, as shown in FIG. 1. Thereafter, the connector 1 is attached to the board 3. In this manner, an intended opto-electric hybrid module is produced.

In the connector 1, the optical element 13 and the aligning protrusions 1a are in determined positional relationship with each other, as mentioned earlier. In the opto-electric hybrid unit 2, the one end surface of the core 25 and the fitting holes 2a are in a determined positional relationship with each other. Thus, coupling the connector 1 and the opto-electric hybrid unit 2 to each other by fitting the aligning protrusions 1a of the connector 1 into the fitting holes 2a of the opto-electric hybrid unit 2 automatically brings the optical element 13 and the one end surface of the core 25 into precise alignment and into face-to-face relationship with each other so that light propagation therebetween is achieved.

In this manner, the simple operation of fitting the aligning protrusions 1a of the connector 1 into the fitting holes 2a of the opto-electric hybrid unit 2 allows the coupling of the connector 1 and the opto-electric hybrid unit 2 so that light propagation therebetween is achieved. Therefore, the opto-electric hybrid module is excellent in productivity.

Figure 8:
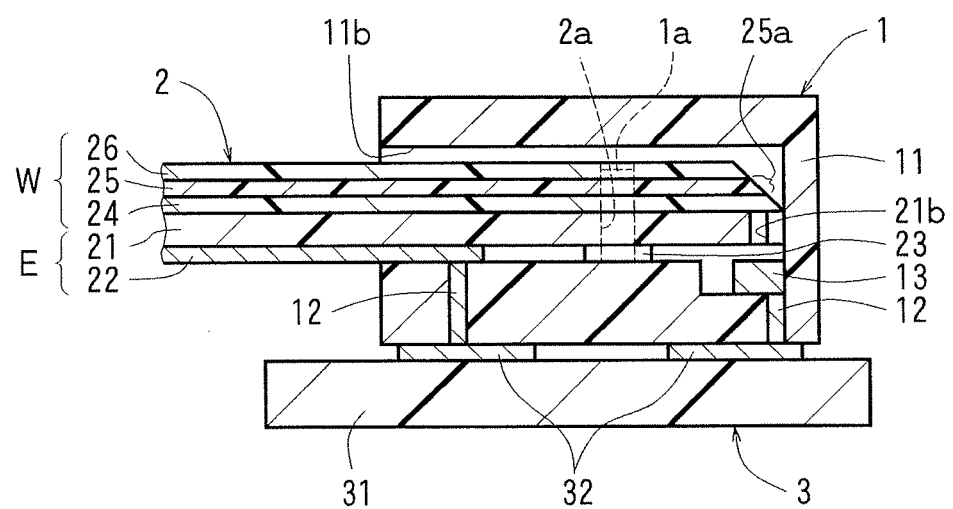
FIG. 8 is a vertical sectional view schematically showing a second embodiment of the opto-electric hybrid module according to the present invention.

FIG. 8 is a vertical sectional view schematically showing a second embodiment of the opto-electric hybrid module according to the present invention. The opto-electric hybrid module according to this embodiment is configured such that one end portion of the optical waveguide W as in the first embodiment shown in FIGS. 1A and 1B is in the form of an inclined surface inclined at 45° with respect to the axial direction of the core 25 and such that one end surface of the core 25 at the inclined surface is a light reflecting surface 25a. The optical element 13 is mounted in part of the connector 1 which lies under the light reflecting surface 25a. A through hole 21b for an optical path is formed in part of the insulative sheet 21 of the electric circuit board E which serves as an optical path. The remaining parts of the second embodiment are similar to those of the first embodiment. Like reference numerals and characters are used in the second embodiment to designate parts similar to those of the first embodiment. The second embodiment produces functions and effects similar to those of the first embodiment.

In the first and second embodiments, the connector 1 is attached to the board 3 after the opto-electric hybrid unit 2 is coupled to the connector 1. However, the procedure may be reversed in such a manner that the opto-electric hybrid unit 2 is coupled to the connector 1 after the connector 1 is attached to the board 3.

In FIG. 1B, FIG. 8 and the like which illustrate the first and second embodiments, the aligning protrusions 1a are shown as higher and the opto-electric hybrid unit 2 is shown as thicker for ease of understanding. The actual dimensions of the aligning protrusions 1a and the opto-electric hybrid unit 2 are set so as to enable one end portion of the opto-electric hybrid unit 2 to be inserted into the recessed portion 11b of the connector 1 and to enable the aligning protrusions 1a in the recessed portion 11b to be fitted into the fitting holes 2a of the opto-electric hybrid unit 2. A top portion of the recessed portion 11b of the connector 1 may be prepared as a separate part and attached to the connector 1 after the aforementioned fitting engagement.

Figure 9:
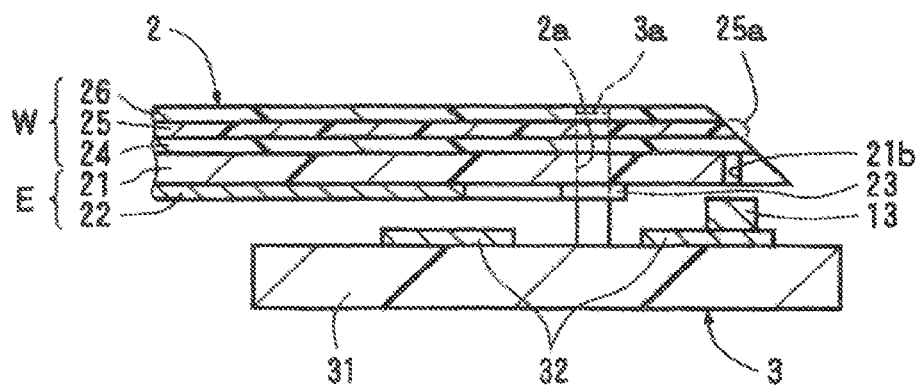
FIG. 9 is a vertical sectional view schematically showing a third embodiment of the opto-electric hybrid module according to the present invention.

FIG. 9 is a vertical sectional view schematically showing a third embodiment of the opto-electric hybrid module according to the present invention. The opto-electric hybrid module according to this embodiment is configured such that the connector 1 (with reference to FIG. 8) in the second embodiment shown in FIG. 8 is not provided and such that the optical element 13 is mounted on the board (optical element unit) 3. Aligning protrusions 3a for fitting engagement with the fitting holes 2a of the opto-electric hybrid unit 2 are formed on a surface of the insulative substrate 31 of the board 3. Thus, the alignment between the optical element 13 and one end surface of the core 25 for light propagation is performed by the fitting engagement between the aligning protrusions 3a of the board 3 and the fitting holes 2a of the opto-electric hybrid unit 2. The remaining parts of the third embodiment are similar to those of the second embodiment. Like reference numerals and characters are used in the third embodiment to designate parts similar to those of the second embodiment. The third embodiment produces functions and effects similar to those of the second embodiment.

Figure 10:
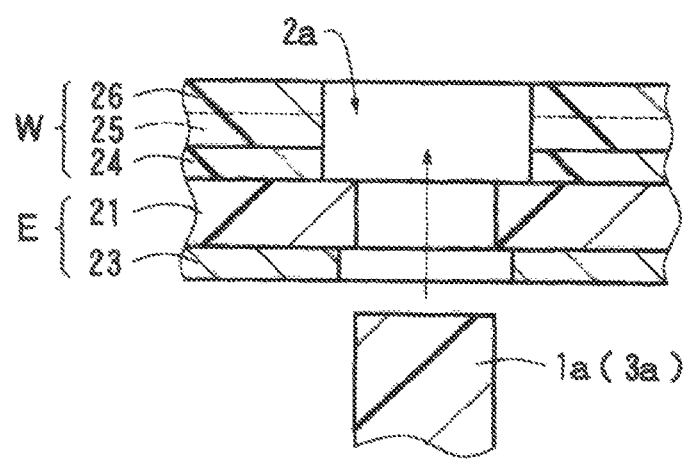
FIG. 10 is an enlarged vertical sectional view schematically showing a first modification of a fitting hole in the opto-electric hybrid unit.

In the aforementioned embodiments, the inside diameter of the fitting holes 2a is slightly greater than the outside diameter of the aligning protrusions 1a and 3a for fitting engagement with the fitting holes 2a. However, as shown in FIG. 10, the insulative sheet 21 of the electric circuit board E may be configured to protrude slightly toward the inside of the fitting holes 2a. Such a configuration allows the protruding portion of the insulative sheet 21 to fill a slight gap between the outer peripheral surface of the aligning protrusions 1a and 3a and the inner peripheral surface of the fitting holes 2a when the aligning protrusions 1a and 3a are fitted in the fitting holes 2a, thereby stabilizing the fitting engagement of the aligning protrusions 1a and 3a.

Figure 11:
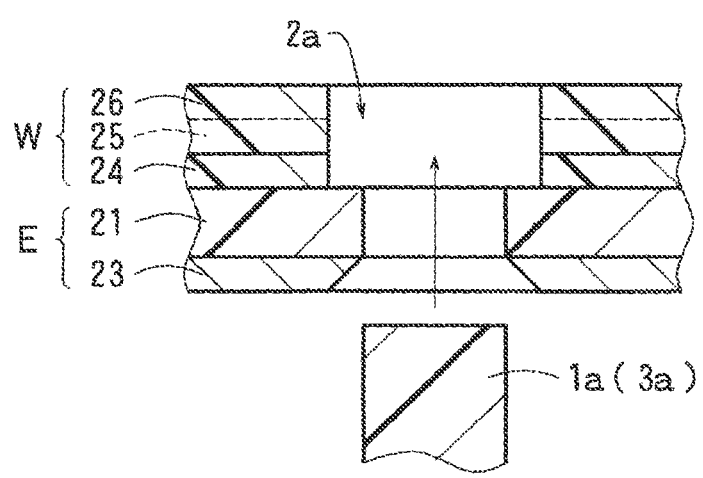
FIG. 11 is an enlarged vertical sectional view schematically showing a second modification of the fitting hole in the opto-electric hybrid unit.

Further, as shown in FIG. 11, the fitting hole positioning interconnect lines 23 around the openings of the fitting holes 2a may be configured by cutting, grinding and the like so that the diameter of future fitting hole regions of the fitting hole positioning interconnect lines 23 decreases gradually in the direction toward the fitting hole 2a. This allows the axis of the aligning protrusions 1a and 3a to coincide with the central axis of the fitting holes 2a when the aligning protrusions 1a and 3a are fitted in the fitting holes 2a, thereby achieving the alignment with high precision.

Figure 12A:
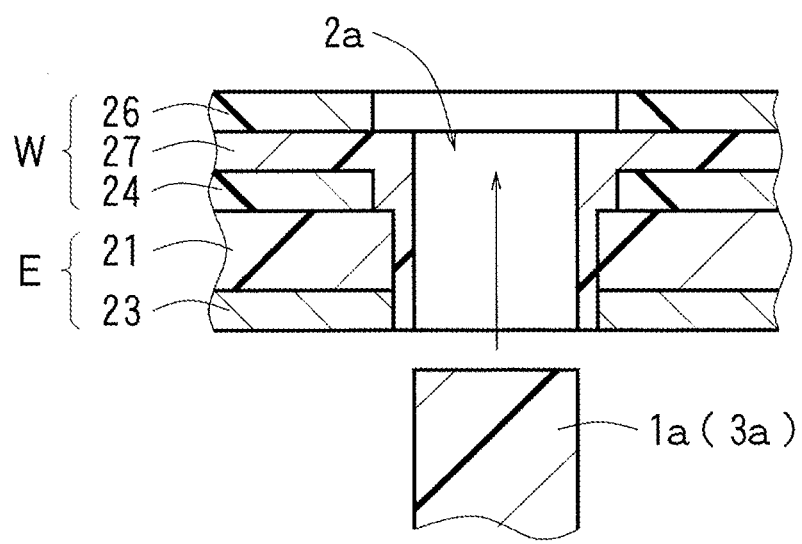
FIG. 12A is an enlarged vertical sectional view schematically showing a third modification of the fitting hole in the opto-electric hybrid unit.
Figure 12B:
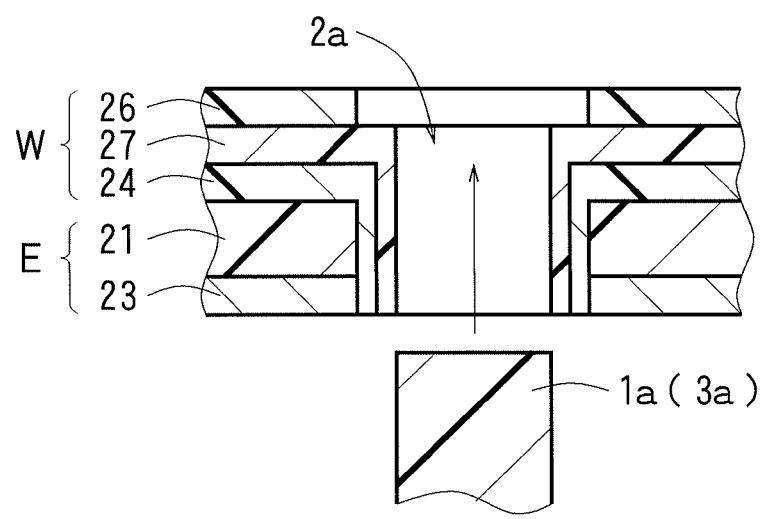
FIG. 12B is an enlarged vertical sectional view schematically showing a fourth modification of the fitting hole in the opto-electric hybrid unit.

Also, as shown in FIG. 12A, a dummy core 27 used for light propagation may be formed along the peripheral portion and the inner peripheral surface of the fitting holes 2a at the same time as the core 25 [with reference to FIG. 6D]. Alternatively, as shown in FIG. 12B, the under cladding layer 24 and the dummy core 27 may be formed along the inner peripheral surface of the fitting holes 2a. Such configurations also allow the portions formed along the inner peripheral surface of the fitting holes 2a to fill a slight gap between the outer peripheral surface of the aligning protrusions 1a and 3a and the inner peripheral surface of the fitting holes 2a in the aforementioned manner, thereby stabilizing the fitting engagement of the aligning protrusions 1a and 3a.

Next, an inventive example of the present invention will be described in conjunction with a comparative example. It should be noted that the present invention is not limited to the inventive example.

EXAMPLES

Inventive Example

A connector with a light-emitting element mounted therein and an opto-electric hybrid unit were individually produced and thereafter coupled to each other in the same manner as in the first embodiment [with reference to FIGS. 1A and 1B]. Aligning protrusions had the following dimensions: an outside diameter of 1.5 mm and a height of 2.0 mm. Fitting holes had the following dimensions: an inside diameter of 1.55 mm and a depth of 0.2 mm. A center-to-center distance between adjacent ones of the aligning protrusions, and a center-to-center distance between adjacent ones of the fitting holes were 10 mm.

Comparative Example

A connector was produced in a same manner as the Example except for including no aligning protrusions and an opto-electric hybrid unit was produced in a same manner as the Example except for including no fitting holes. Thereafter, light from the light-emitting element of the connector was measured through a core of the opto-electric hybrid unit. The opto-electric hybrid unit was coupled at a position where the light had the highest intensity to the connector.

In the Inventive Example described above, light could be propagated between the light-emitting element and the core at the same time that the connector and the opto-electric hybrid unit were coupled to each other. In Comparative Example, on the other hand, it required time to achieve the light propagation.

Although specific forms in the present invention have been described in the aforementioned inventive example, the aforementioned example should be considered as merely illustrative and not restrictive. It is contemplated that various modifications evident to those skilled in the art could be made without departing from the scope of the present invention.

The opto-electric hybrid module according to the present invention is usable when the optical element unit and the opto-electric hybrid unit are coupled together in a short time so as to be capable of light propagation.

What is claimed is:

1. An opto-electric hybrid module comprising:
    an optical element unit including an optical element; and
    an opto-electric hybrid unit including an electric circuit board and an optical waveguide which are stacked together,
    wherein the optical element unit includes an aligning protrusion positioned and formed in a predetermined position with respect to the optical element,
    wherein the opto-electric hybrid unit includes a fitting hole for fitting engagement with the aligning protrusion, the fitting hole being positioned and formed in a predetermined position with respect to an end surface of a core for an optical path of the optical waveguide,
    wherein the optical element unit and the opto-electric hybrid unit are coupled together, with the aligning protrusion of the optical element unit fitted in the fitting hole of the opto-electric hybrid unit, whereby the optical element and the core for an optical path are aligned with each other so as to be capable of light propagation.

* * * * *